United States Patent
Li et al.

(10) Patent No.: US 11,592,742 B2
(45) Date of Patent: Feb. 28, 2023

(54) PHOTORESIST COMPOSITION, ITS MANUFACTURING METHOD, AND MANUFACTURING METHODS OF METAL PATTERN AND ARRAY SUBSTRATE

(71) Applicants: Hefei Xinsheng Optoelectronics Technology Co., Ltd., Anhui (CN); BOE Technology Group Co., Ltd., Beijing (CN)

(72) Inventors: Wei Li, Beijing (CN); Guangcai Yuan, Beijing (CN); Bin Zhou, Beijing (CN); Dongfang Wang, Beijing (CN); Jun Cheng, Beijing (CN); Yingbin Hu, Beijing (CN); Jingjing Xia, Beijing (CN); Tongshang Su, Beijing (CN)

(73) Assignees: Hefei Xinsheng Optoelectronics Technology Co., Ltd., Anhui (CN); BOE Technology Group Co., Ltd., Beijing (CN)

( * ) Notice: Subject to any disclaimer, the term of this patent is extended or adjusted under 35 U.S.C. 154(b) by 816 days.

(21) Appl. No.: 16/320,041

(22) PCT Filed: May 22, 2018

(86) PCT No.: PCT/CN2018/087881
§ 371 (c)(1),
(2) Date: Jan. 23, 2019

(87) PCT Pub. No.: WO2019/037491
PCT Pub. Date: Feb. 28, 2019

(65) Prior Publication Data
US 2021/0333710 A1    Oct. 28, 2021

(30) Foreign Application Priority Data

Aug. 25, 2017  (CN) .......................... 201710743674.4

(51) Int. Cl.
G03F 7/021 (2006.01)
G03F 7/038 (2006.01)
(Continued)

(52) U.S. Cl.
CPC ............ *G03F 7/0212* (2013.01); *G03F 7/038* (2013.01); *G03F 7/039* (2013.01);
(Continued)

(58) Field of Classification Search
None
See application file for complete search history.

(56) References Cited

U.S. PATENT DOCUMENTS 4,172,724 A * 10/1979 Matsumoto ............. G03F 7/001
430/1
4,291,115 A * 9/1981 Chambers ........... C08F 299/026
430/300
(Continued)

FOREIGN PATENT DOCUMENTS

CN  1171847 A   1/1998
CN  1202913 A   12/1998
(Continued)

OTHER PUBLICATIONS

Machine translation of CN 102830589 (Dec. 2012).*
(Continued)

*Primary Examiner* — Martin J Angebranndt
(74) *Attorney, Agent, or Firm* — Banner & Witcoff, Ltd.

(57) ABSTRACT

A photoresist composition and manufacturing method thereof, a manufacturing method of a metal pattern, and a manufacturing method of an array substrate are provided. The photoresist composition includes a base material and an ion adsorbent, and the ion adsorbent is chelating resin.

13 Claims, 1 Drawing Sheet

(51) Int. Cl.
 G03F 7/039 (2006.01)
 G03F 7/027 (2006.01)
 H01L 21/027 (2006.01)
 H01L 21/283 (2006.01)
 H01L 21/3213 (2006.01)
 H01L 21/77 (2017.01)
(52) U.S. Cl.
 CPC ........ H01L 21/0273 (2013.01); H01L 21/283 (2013.01); H01L 21/32134 (2013.01); H01L 21/32139 (2013.01); *H01L 2021/775* (2013.01)

(56) References Cited

U.S. PATENT DOCUMENTS

| | | | | |
|---|---|---|---|---|
| 4,352,878 A | * | 10/1982 | Miura | G03F 7/085 430/196 |
| 4,477,552 A | * | 10/1984 | Day | G03F 7/0212 430/141 |
| 4,675,252 A | * | 6/1987 | Hashimoto | C08J 7/0427 428/431 |
| 4,963,463 A | * | 10/1990 | Koshiba | C08F 8/34 430/165 |
| 5,070,001 A | * | 12/1991 | Stahlhofen | G03F 7/0955 430/281.1 |
| 5,300,628 A | | 4/1994 | Honda | |
| 5,378,802 A | | 1/1995 | Honda | |
| 5,391,458 A | * | 2/1995 | Conrad | G03F 7/027 430/258 |
| 5,445,916 A | * | 8/1995 | Curtis | G03F 7/0388 430/270.1 |
| 5,446,125 A | | 8/1995 | Honda et al. | |
| 5,658,706 A | * | 8/1997 | Niki | G03F 7/039 430/270.1 |
| 5,677,110 A | * | 10/1997 | Chia | G03F 7/092 430/278.1 |
| 5,691,101 A | * | 11/1997 | Ushirogouchi | G03F 7/0045 430/176 |
| 5,962,183 A | | 10/1999 | Rahman et al. | |
| 6,737,212 B1 | * | 5/2004 | Takahashi | G03F 7/0233 430/191 |
| 2003/0054284 A1 | * | 3/2003 | Suzuki | G03F 7/0233 430/192 |
| 2009/0087788 A1 | * | 4/2009 | Kanchiku | G03F 7/031 524/92 |
| 2010/0132771 A1 | * | 6/2010 | Lu | C01B 32/162 438/73 |
| 2010/0295190 A1 | | 11/2010 | Mitsukura et al. | |
| 2011/0223540 A1 | * | 9/2011 | Savariar-Hauck | B41N 3/08 430/302 |
| 2013/0306920 A1 | * | 11/2013 | Maeda | C09B 23/083 252/586 |
| 2018/0352611 A1 | * | 12/2018 | Kim | H05B 3/86 |

FOREIGN PATENT DOCUMENTS

| | | | |
|---|---|---|---|
| CN | 101149541 A | | 3/2008 |
| CN | 101681104 A | | 3/2010 |
| CN | 102262357 A | | 11/2011 |
| CN | 102786662 A | | 11/2012 |
| CN | 102830589 | * | 12/2012 |
| CN | 102830589 A | | 12/2012 |
| CN | 104423165 A | | 3/2015 |
| EP | 0800664 B1 | | 5/2001 |
| JP | 60-090202 | * | 5/1985 |
| JP | 11-072914 | * | 3/1999 |
| WO | WO-9827461 A1 | * | 6/1998 ............. G03F 7/004 |

OTHER PUBLICATIONS

Machine translation of JP 11-072914 (1999).*
Jul. 31, 2018—(WO) International Search Report and the Written Opinion Appn PCT/CN2018/087881 with English Translation.
May 7, 2020—(CN) Second Office Action Appn 201710743674.4 with English Translation.
Dec. 9, 2019—(CN) First Office Action Appn 201710743674.4 with English Translation.

* cited by examiner

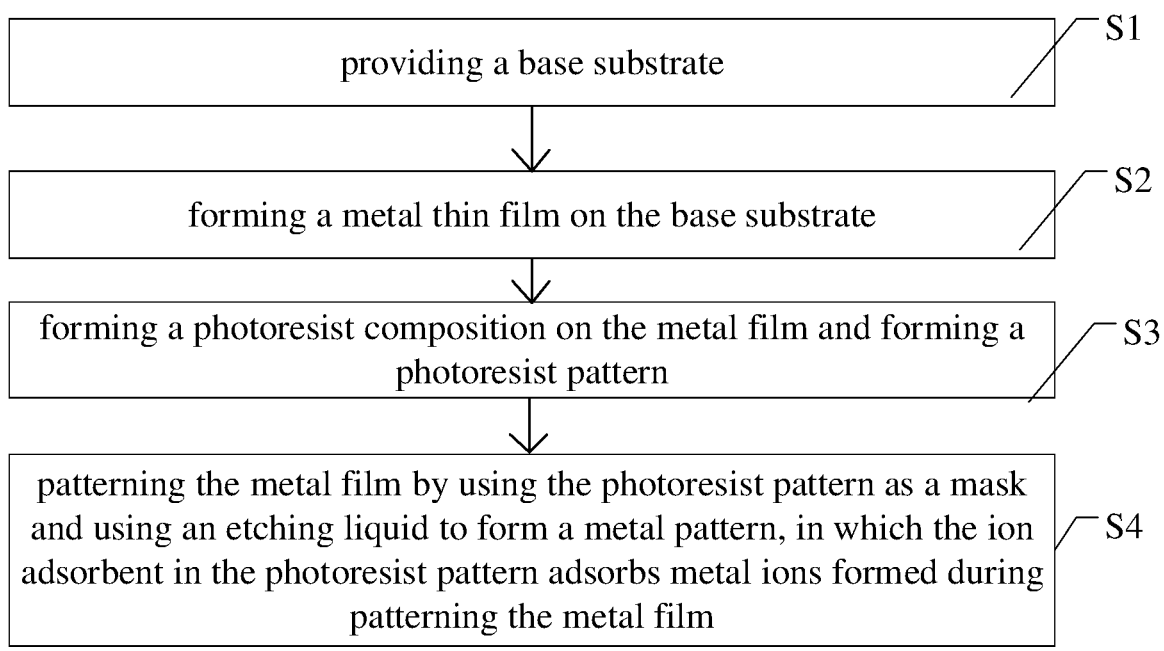

PHOTORESIST COMPOSITION, ITS MANUFACTURING METHOD, AND MANUFACTURING METHODS OF METAL PATTERN AND ARRAY SUBSTRATE

The application is a U.S. National Phase Entry of International Application No. PCT/CN2018/087881 filed on May 22, 2018, designating the United States of America and claiming priority to Chinese Patent Application No. 201710743674.4 filed on Aug. 25, 2017. The present application claims priority to and the benefit of the above-identified applications and the above-identified applications are incorporated by reference herein in their entirety.

TECHNICAL FIELD

Embodiments of the present disclosure relate to a photoresist composition, a manufacturing method of the photoresist composition, a manufacturing method of a metal pattern and a manufacturing method of an array substrate.

BACKGROUND

Photoresist refers to a corrosion-resistant film material which changes in solubility upon being illuminated by ultraviolet light, electron beam, particle beam, x-ray and so on. The photoresist is a key material for a lithography process. The photoresist can be classified as a positive photoresist and a negative photoresist according to its change in solubility before and after exposure. The solubility of the positive photoresist is increased after exposure, whereas the solubility of the negative photoresist is reduced after exposure.

The photolithography process is an indispensable process for manufacturing an array substrate, and a pattern with a desired shape can be obtained, and the photoresist is indispensable to implementation of the photolithography process. A main component of the photoresist is a photosensitive group-containing polymer. Under irradiation of ultraviolet light and the like, photosensitive groups of the irradiated photoresist undergo a chemical reaction, which results in difference in the solubility of the photosensitive portion and the light-shielding portion of the photoresist in a developer and thus forms a pattern with a desired shape after developing.

SUMMARY

At least one embodiment of the present disclosure provides a photoresist composition, and the photoresist composition includes: a base material and an ion adsorbent, in which the ion adsorbent is a chelating resin.

For example, in the photoresist composition provided by at least one embodiment of the present disclosure, the chelating resin comprises any one or any combination of an acrylic chelating resin, a glycine-based chelating resin, a mercapto-based chelating resin, a polyacrylic mercapto-based chelating resin, an 8-hydroxyquinoline-based chelating resin, a polyvinyl pyridine chelating resin, a Schiff-base chelating resin.

For example, in the photoresist composition provided by at least one embodiment of the present disclosure, the chelating resin comprises any one or any combination of polyacrylic ethylenediimine diacetic acid chelating resin, poly (4-glycine-methylene styrene) chelating resin, poly (2-hydroxyl-3-mercaptopropyl acrylate) chelating resin, poly (6-vinyl-8-hydroxyquinoline) chelating resin, poly (2-carboxy-4-vinylpyridine) chelating resin and poly 4-vinylpyridine chelating resin.

For example, in the photoresist composition provided by at least one embodiment of the present disclosure, the base material comprises a film-forming resin, a photosensitizer, and an organic solvent, and the photoresist composition is a positive photoresist composition or a negative photoresist composition.

For example, the photoresist composition provided by at least one embodiment of the present disclosure further comprises an additive, and a mass percentage of the film-forming resin is about 5% to 30%; a mass percentage of the photosensitizer is about 2% to 5%; a mass percentage of the ion adsorbent is about 0.1% to 2%; a mass percentage of the organic solvent is about 62% to 93%; and a mass percentage of the additive is about 0.1% to 1%.

For example, in the photoresist composition provided by at least one embodiment of the present disclosure, the organic solvent comprises any one or any combination of N-methyl pyrrolidone, glycol ether, ethylene glycol alkyl ether acetate, diethylene glycol, propylene glycol monomethyl ether acetate, ethoxyethyl acetate, dimethoxy acetaldehyde, propylene glycol methyl ether acetate, ethyl 3-ethoxypropionate, propylene glycol methyl ether (PM) and ethylene glycol ethyl ether acetate.

For example, in the photoresist composition provided by at least one embodiment of the present disclosure, in a case that the photoresist composition is the positive photoresist composition, the film-forming resin comprises any one or any combination of a phenolic resin, a silicone resin, and a polyimide.

For example, in the photoresist composition provided by at least one embodiment of the present disclosure, the photosensitizer is a diazonaphthoquinone-based photo sensitizer.

For example, in the photoresist composition provided by at least one embodiment of the present disclosure, the diazonaphthoquinone-based photosensitizer comprises any one or two of 2,3,4-trihydroxybenzophenone naphthoquinone-1,2-diazido-5-sulfonate and 2,3,4,4'-tetrahydroxybenzophenone naphthoquinone-1,2-diazido-5-sulfonate.

For example, in the photoresist composition provided by at least one embodiment of the present disclosure, in a case that the photoresist composition is the negative photoresist composition, the film-forming resin is a copolymer of an organic ester monomer and an organic acid monomer.

For example, in the photoresist composition provided by at least one embodiment of the present disclosure, the organic ester monomer comprises any one or any combination of methyl methacrylate, ethyl methacrylate, propyl methacrylate, butyl methacrylate, isobutyl methacrylate and isoamyl acrylate; the organic acid monomer comprises any one or any combination of methacrylic acid, crotonic acid, cinnamic acid, isocinnamic acid, alpha-methyl cinnamic acid, methyl acrylate and methyl butenoate.

For example, in the photoresist composition provided by at least one embodiment of the present disclosure, the photosensitizer comprises any one or any combination of nitroaniline, anthraquinone, benzophenone and N-acetyl-4-nitro-1-naphthylamine.

For example, in the photoresist composition provided by at least one embodiment of the present disclosure, the negative photoresist composition further comprises a polymerizable monomer, and the polymerizable monomer comprises any one or any combination of dipentaerythritol pentaacrylate, dipentaerythritol hexaacrylate, polyurethane acrylate and ethoxylated pentaerythritol tetraacrylate.

For example, in the photoresist composition provided by at least one embodiment of the present disclosure, the negative photoresist composition further comprises a polymerization inhibitor, and the polymerization inhibitor comprises any one or any combination of hydroquinone, 2-sec-butyl-4,6-dinitrophenol, p-tert-butyl catechol and 2,5-di-tert-butyl hydroquinone.

For example, in the photoresist composition provided by at least one embodiment of the present disclosure, the additive comprises at least one of a leveling agent, an antifoaming agent, and a stabilizer.

At least one embodiment of the present disclosure further provides a manufacturing method of a photoresist composition, and the manufacturing method includes: mixing a base material and an ion adsorbent, in which the ion adsorbent is a chelating resin.

For example, in the manufacturing method provided by at least one embodiment of the present disclosure, the base material comprises a film-forming resin, a photosensitizer, an organic solvent, and an additive.

For example, in the manufacturing method provided by at least one embodiment of the present disclosure, a mass percentage of the film-forming resin is about 5% to 30%; a mass percentage of the photosensitizer is about 2% to 5%; a mass percentage of the ion adsorbent is about 0.1% to 2%; a mass percentage of the organic solvent is about 62% to 93%; and a mass percentage of the additive is about 0.1% to 1%.

At least one embodiment of the present disclosure further provides a manufacturing method of a metal pattern, and the manufacturing method includes: providing a base substrate; forming a metal film on the base substrate; forming any photoresist composition described above on the metal film, and forming a photoresist pattern; and patterning the metal film by using the photoresist pattern as a mask and using an etching liquid to form a metal pattern; and the method further comprises: adsorbing metal ions formed during patterning the metal film by using the ion adsorbent in the photoresist pattern.

For example, in the manufacturing method provided by at least one embodiment of the present disclosure, a material of the metal film comprises any one or any combination of aluminum (Al), copper (Cu), molybdenum (Mo), chromium (Cr), aluminum-copper alloy (AlCu), copper-molybdenum alloy (CuMo), molybdenum aluminum alloy (MoAl), aluminum chromium alloy (AlCr), copper chromium alloy (CuCr), molybdenum chromium alloy (MoCr), and copper molybdenum aluminum alloy (CuMoAl).

For example, in the manufacturing method provided by at least one embodiment of the present disclosure, the etching liquid comprises a hydrogen peroxide solution.

At least one embodiment of the present disclosure further provides a manufacturing method of an array substrate, and the manufacturing method any one of the manufacturing methods of the metal pattern described above.

For example, in the manufacturing method provided by at least one embodiment of the present disclosure, the metal pattern comprises at least one of a gate electrode, a first source/drain electrode, and a second source/drain electrode.

BRIEF DESCRIPTION OF THE DRAWINGS

In order to clearly illustrate the technical solution of the embodiments of the present disclosure, the drawing of the embodiments will be briefly described. It is apparent that the described drawing is only related to some embodiments of the present disclosure and thus are not limitative of the present disclosure.

FIG. 1 is a flowchart of a manufacturing method of a metal pattern provided by an embodiment of the present disclosure.

DETAILED DESCRIPTION

In order to make objects, technical details and advantages of embodiments of the present disclosure clear, the embodiments of the present disclosure will be described in a clearly and fully understandable way in connection with the related drawing. It is apparent that the described embodiments are just a part but not all of the embodiments of the present disclosure. Based on the described embodiments herein, one of ordinary skill in the art can obtain, without any inventive work, other embodiment(s) which should be within the scope of the present disclosure.

Unless otherwise defined, all the technical and scientific terms used herein shall have the same meanings as commonly understood by one of ordinary skill in the art to which the present invention belongs. The terms "comprises," "comprising," "includes," "including," etc., are intended to specify that the elements or the objects stated before these terms encompass the elements or the objects listed after these terms as well as equivalents thereof, but do not exclude other elements or objects.

A wet etching process is suitable for etching a metal thin film. At present, a gate electrode, a source electrode and a drain electrode of a thin film transistor array substrate are mainly made of Cu metal or Al metal, and the corresponding etching liquid is generally a hydrogen peroxide solution or another acidic etching solution. During etching, in addition to the concentration of hydrogen peroxide or other acidic component in the etching liquid, the concentration of metal ions in the etching liquid, for example, the concentration of $Cu^{2+}$ or $Al^{3+}$ generated during etching also affects the etching rate. Furthermore, a change frequency of the etching liquid depends on the concentration of metal ions in etching liquid. Therefore, considering the product quality and production cost, it is important to keep the concentration of the metal ions in the etching liquid within a reasonable and stable range.

In a photoresist composition provided by at least one embodiment of the present disclosure, the photoresist composition comprises a base material and an ion adsorbent, and the ion adsorbent is a chelating resin. The chelating resin in the photoresist composition has a selective adsorption effect on metal ions, such as at least one of $Cu^{2+}$ and $Al^{3+}$ generated during etching. In the wet etching process, during etching a metal film by using a photoresist pattern formed from the photoresist composition as a mask, the chelating resin in the photoresist pattern can adsorb metal ions generated during etching. As such, the concentration of the metal ions in the etching liquid maintains at a stable level to achieve a stable etching rate, and thus the etching stability and uniformity together with the quality of the product are improved. In addition, the service life of the etching liquid is prolonged and the production cost is reduced.

At least one embodiment of the present disclosure provides a photoresist composition, and the photoresist composition includes: a base material and an ion adsorbent, in which the ion adsorbent is a chelating resin.

The chelating resin is a polymer material having a cross-linking function, which can interact with a metal ion to form a multi-coordination complex. Not only can the chelating resin bond directly with the metal ion as a whole, but also some functional groups dissociated from the chelating resin can bond with the metal ion. A mechanism of adsorbing the metal ion by the chelating resin is that a coordination reaction occurs between functional atoms on the chelating resin and the metal ion to form a stable structure similar to a small molecular chelating. That is, the chelating resin takes a crosslinked polymer as its skeleton, and its atom containing a lone pair of electrons combines with vacant orbit of the metal ion to form a coordination bond, and thus the metal ion is adsorbed. In addition, the chelating resin can also capture the metal ion quickly, and it is also easy to release the captured metal ion in a specific environment. Therefore, compared with an ion exchange resin, the chelating resin has a stronger binding force and a higher selectivity with the metal ion.

For example, chelating resins that can adsorb metal ions are divided into two categories: natural chelating resins and synthetic chelating resins. The synthetic chelating resins can further be divided into two types according to the position of their functional groups: one is that the functional groups of the chelating resins are directly attached to the resin skeleton; and the other is that the functional groups are formed on a side chain and connected to the skeletons of the chelating resin by the side chain.

For example, functional groups of the chelating resins are mostly atoms with a lone pair of electrons, such as nitrogen, sulfur, oxygen and phosphorus. For example, the functional groups containing an oxygen atom include —OH (hydroxyl), —COOR (ester), —COOH (carboxyl), —O— (ether bond), —NO (nitroso) and —NO$_2$ (nitro). The functional groups containing a nitrogen atom include —NH$_2$ (primary amino), —NHR (secondary amino), —NR$_2$ (tertiary amino), —CONH$_2$ (amido), etc. The functional groups containing a sulfur atom include —SH (mercapto), —S— (thioether group), etc. The functional groups containing a phosphorus atom include an alkyl phosphino, a dialkyl phosphino, a trialkyl phosphine or an aryl phosphino.

For example, in the photoresist composition provided by at least one embodiment of the present disclosure, the chelating resin comprises any one or any combination of an acrylic chelating resin, a glycine-based chelating resin, a mercapto-based chelating resin, a polyacrylic mercapto-based chelating resin, an 8-hydroxyquinoline-based chelating resin, a polyvinyl pyridine chelating resin, a Schiff-base chelating resin.

For example, the groups —COOH, —SH, —NH$_2$ and so on included in the chelating resin form a complex with the metal ion, thus the metal ion in the etching liquid is adsorbed to the main body of the chelating resin. For example, the metal ion includes at least one of $Cu^{2+}$, $Ni^{2+}$, $Zn^{2+}$, $Al^{3+}$, $Cr^{2+}$, $Pb^{2+}$ and $Mo^{3+}$.

For example, the chelating resin comprises any one or any combination of polyacrylic ethylenediimine diacetic acid chelating resin

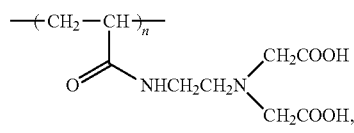

poly (4-glycine-methylene styrene) chelating resin

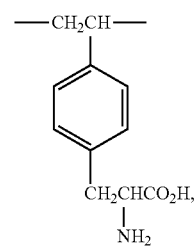

poly (2-hydroxyl-3-mercaptopropyl acrylate) chelating resin

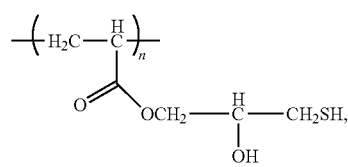

poly (6-vinyl-8-hydroxyquinoline) chelating resin

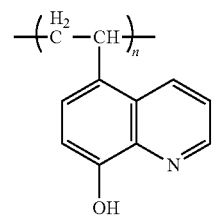

poly (2-carboxy-4-vinylpyridine) chelating resin

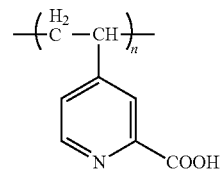

and poly 4-vinylpyridine chelating resin

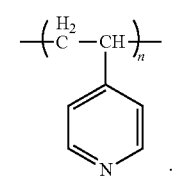

For example, the steps of synthesizing the polyacrylic ethylenediimine diacetic acid chelating resin include:

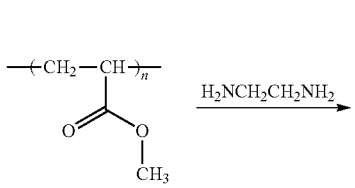

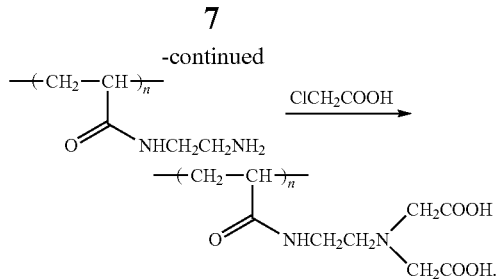

For example, the steps of synthesizing polyacrylic ethylenediimine diacetic acid chelating resin include: reacting poly (methyl acrylate) (abbreviated as PMA) with ethylenediamine to form a polyacrylamide ethylamine resin (PMA-$NH_2$), and then reacting the PMA-$NH_2$ with chloroacetic acid under an alkaline condition to obtain polyacrylic ethylenediimine diacetic acid chelating resin having a semi-EDTA type.

For example, the steps of synthesizing poly (4-glycine-methylene styrene) chelating resin include:

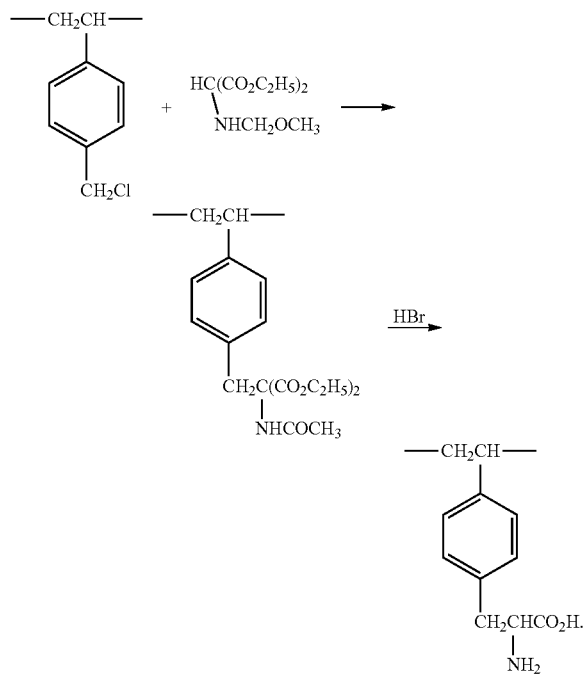

For example, the steps of synthesizing poly (4-glycine-methylene styrene) chelating resin include: reacting polychloromethylstyrene with diethyl acetamidomalonate under a strong alkaline as a catalyst to form diethyl acetamidomalonate-substituted styrene polymer, and then forming the target product poly (4-glycine-methylene styrene) by refluxing the diethyl acetamidomalonate-substituted styrene polymer in hydrobromic acid for about 48 hours.

For example, the steps of synthesizing poly (2-hydroxyl-3-mercaptopropyl acrylate) chelating resin include:

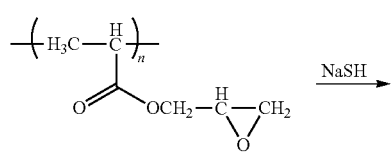

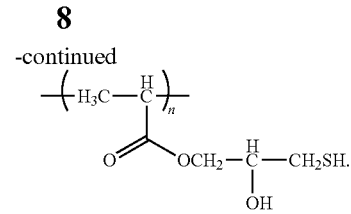

For example, the steps of synthesizing poly (2-hydroxyl-3-mercaptopropyl acrylate) chelating resin include: swelling poly (epoxy propyl acrylate) resin in NaSH solution for about 12 hours, then heating to 85° C. and refluxing for 24 hours, and washing the product by deionized water after the reaction is completed.

For example, the structure of Schiff-base chelating resin has an atom containing a lone pair of electrons which is N or O, and generally, also has a phenolic hydroxyl.

For example, 8-hydroxyquinoline chelating resin has a good adsorption for divalent metal ions and trivalent metal ions, and it is easy to form a tetradentate chelate with a copper ion. The 8-hydroxyquinoline chelating resin is generally synthesized by a condensation reaction of a polyaldehyde containing a phenolic hydroxyl group and a polybasic primary amine, or by a condensation reaction of a polyaldehyde and a polybasic primary amine containing a phenolic hydroxyl group.

For example, the base material comprises a film-forming resin, a photosensitizer, and an organic solvent, and the photoresist composition is a positive photoresist composition or a negative photoresist composition.

For example, the substrate material further includes an additive. In an example, a mass percentage of the film-forming resin is about 5% to 30%; a mass percentage of the photosensitizer is about 2% to 5%; a mass percentage of the ion adsorbent is about 0.1% to 2%; a mass percentage of the organic solvent is about 62% to 93%; and a mass percentage of the additive is about 0.1% to 1%.

For example, the film-forming resin is a main material to afford the photoresist composition a film-forming property; the photosensitizer makes the photoresist composition sensitive to light, such as the ultraviolet light; the organic solvent is a carrier of the film-forming resin and the photosensitizer, and the organic solvent only needs to afford uniform dispersion of the film-forming resin and the photosensitizer therein.

For example, the organic solvent comprises any one or any combination of N-methyl pyrrolidone, glycol ether, ethylene glycol alkyl ether acetate, diethylene glycol, propylene glycol monomethyl ether acetate, ethoxyethyl acetate, dimethoxy acetaldehyde, propylene glycol methyl ether acetate, ethyl 3-ethoxypropionate, propylene glycol methyl ether (PM) and ethylene glycol ethyl ether acetate.

For example, in a case that the photoresist composition is a positive photoresist composition, the film-forming resin comprises any one or any combination of a phenolic resin, a silicone resin, and a polyimide.

For example, the phenolic resin is manufactured by reacting a phenolic compound with an aldehyde compound or a ketone compound in the presence of an acidic catalyst.

For example, the photosensitizer is a diazonaphthoquinone-based photosensitizer.

For example, the diazonaphthoquinone-based photosensitizer is manufactured by reacting a diazonaphthoquinone sulfonyl halide compound with a phenolic compound in the presence of a weak alkaline.

For example, the diazonaphthoquinone-based photosensitizer includes: any one or two of 2,3,4-trihydroxybenzophenone naphthoquinone-1,2-diazido-5-sulfonate and 2,3,4,4'-tetrahydroxybenzophenone naphthoquinone-1,2-diazido-5-sulfonate.

For example, the film-forming resin described above has a polymer chain, and the photosensitizer also has a polymer chain. The photosensitizer and the film-forming resin have a similar structure, and their compatibility is good. As such, the distribution of the photosensitive groups is more uniform, thereby obtaining a better sensitivity and film-forming property.

For example, the solubility of the positive photoresist increases after exposure, and a portion of the positive photoresist exposed by ultraviolet light is removed.

For example, in a case that the photoresist composition is a negative photoresist composition, the film-forming resin is a copolymer of an organic ester monomer and an organic acid monomer.

For example, the organic ester monomer comprises any one or any combination of methyl methacrylate, ethyl methacrylate, propyl methacrylate, butyl methacrylate, isobutyl methacrylate and isoamyl acrylate; the organic acid monomer comprises any one or any combination of methacrylic acid, crotonic acid, cinnamic acid, isocinnamic acid, alpha-methyl cinnamic acid, methyl acrylate and methyl butenoate.

For example, in a case of the photoresist composition is a negative photoresist composition, the photosensitizer comprises any one or any combination of nitroaniline, anthraquinone, benzophenone and N-acetyl-4-nitro-1-naphthylamine.

For example, the solubility of the negative photoresist is reduced after exposure, and a portion of the negative photoresist exposed by the ultraviolet light is retained.

For example, the negative photoresist composition may further comprise a polymerizable monomer, and the polymerizable monomer comprises any one or any combination of dipentaerythritol pentaacrylate, dipentaerythritol hexaacrylate, polyurethane acrylate and ethoxylated pentaerythritol tetraacrylate.

For example, the polymerizable monomer undergoes a polymerization to form a polymer after being irradiated.

For example, the function of the polymerizable monomer is to reduce the solubility of the irradiated portion of the photoresist composition by a photoinduced radical polymerization to form a cross-linked polymer network.

For example, the negative photoresist composition may further comprise a polymerization inhibitor, and the polymerization inhibitor comprises any one or any combination of hydroquinone, 2-sec-butyl-4,6-dinitrophenol, p-tert-butyl catechol and 2,5-di-tert-butyl hydroquinone.

For example, the function of the polymerization inhibitor is to prevent an unsaturated bond in the photoresist composition from being polymerized without exposure to light, and thus the stability of the photoresist composition is improved.

For example, in the positive photoresist composition or the negative photoresist composition provided by at least one embodiment of the present disclosure, the additive may comprise at least one of a leveling agent, an antifoaming agent, and a stabilizer.

For example, the leveling agent includes an acrylic compound, a silicone compound, a fluorocarbon compound, etc.

For example, the function of the leveling agent is to adjust the viscosity and fluidity of the photoresist system and increase the uniformity of the film formed.

For example, the antifoaming agent can reduce a surface tension of the photoresist composition, inhibit formation of a foam or eliminate the existing foam. The commonly used antifoaming agent includes emulsified silicone oil, higher alcohol fatty acid ester complex, polyoxyethylene polyoxypropylene pentaerythritol ether, polyoxyethylene polyoxypropylene alcohol ether, polyoxypropylene glycerol ether and polyoxypropylene polyoxyethylene glycerol ether and polydimethyl silicone, etc.

For example, the stabilizer is at least one of isoamyl alcohol, n-hexanol, glycerol, and n-hexane.

For example, the stabilizer can ensure a chemical stability of the photoresist composition, which may slow down reactions, maintain a chemical balance, reduce a surface tension of the photoresist composition, and prevent light, thermal decomposition or oxidative decomposition.

For example, in at least one embodiment of the present disclosure, the photoresist composition comprises: the film-forming resin having a mass percentage of about 5% to 30%; the sensitizer having a mass percentage of about 2% to 5%, the ion adsorbent having a mass percentage of about 0.1% to 2%, the organic solvent having a mass percentage of about 62% to 93%, and the additive having a mass percentage of about 0.1% to 1%.

It should be noted that, the above additive can be the leveling agent, the antifoaming agent and/or the stabilizer in the positive photoresist composition; or the above additive can be the polymerizable monomer, the polymerization inhibitor, the leveling agent, the antifoaming agent and/or the stabilizer in the negative photoresist composition.

For example, the composition of the positive photoresist may exemplarily have the following examples.

Example 1

Phenolic resin with a mass percentage of about 5%; 2,3,4-trihydroxybenzophenone naphthoquinone-1,2-diazido-5-sulfonate with a mass percentage of about 2%; polyacrylic ethylenediimine diacetic acid chelating resin with a mass percentage of about 2%; propylene glycol monomethyl ether acetate with a mass percentage of about 90%; and the additive with a mass percentage of about 1%.

The additive with the mass percentage of about 1% includes: polyacrylic acid with a mass percentage of about 0.3%, polyoxypropylene glycerol ether with a mass percentage of about 0.3%, and glycerol with a mass percentage of about 0.4%.

Example 2

Phenolic resin with a mass percentage of about 10%; 2,3,4-trihydroxybenzophenone naphthoquinone-1,2-diazido-5-sulfonate with a mass percentage of about 3%; polyacrylic ethylenediimine diacetic acid chelating resin with a mass percentage of about 2%; propylene glycol monomethyl ether acetate with a mass percentage of about 84%; and the additive with a mass percentage of about 1%.

The additive with the mass percentage of about 1% includes: polyacrylic acid with a mass percentage of about 0.2%, polyoxypropylene glycerol ether with a mass percentage of about 0.4%, and glycerol with a mass percentage of about 0.4%.

Example 3

Phenolic resin with a mass percentage of about 20%; 2,3,4-trihydroxybenzophenone naphthoquinone-1,2-diazido-5-sulfonate with a mass percentage of about 5%; polyacrylic ethylenediimine diacetic acid chelating resin with a mass percentage of about 1.5%; propylene glycol monomethyl ether acetate with a mass percentage of about 73%; and the additive with a mass percentage of about 0.5%.

The additive with the mass percentage of about 0.5% includes: polyacrylic acid with a mass percentage of about 0.1%, polyoxypropylene glycerol ether with a mass percentage of about 0.2%, and glycerol with a mass percentage of about 0.2%.

Example 4

Phenolic resin with a mass percentage of about 30%; 2,3,4-trihydroxybenzophenone naphthoquinone-1,2-diazido-5-sulfonate with a mass percentage of about 4.5%; polyacrylic ethylenediimine diacetic acid chelating resin with a mass percentage of about 2%; propylene glycol monomethyl ether acetate with a mass percentage of about 63%; and the additive with a mass percentage of about 0.5%.

The additive with the mass percentage of about 0.5% includes: polyacrylic acid with a mass percentage of about 0.1%, polyoxypropylene glycerol ether with a mass percentage of about 0.2%, and glycerol with a mass percentage of about 0.2%.

For example, the composition of the negative photoresist may exemplarily have the following examples.

Example A

A copolymer of methyl methacrylate and methacrylic acid with a mass percentage of about 5%; nitroaniline with a mass percentage of about 2%; polyacrylic ethylenediimine diacetic acid chelating resin with a mass percentage of about 2%; propylene glycol monomethyl ether acetate with a mass percentage of about 90%; and the additive with a mass percentage of about 1%.

The additive with the mass percentage of about 1% includes: polyacrylic acid with a mass percentage of about 0.1%, polyoxypropylene glycerol ether with a mass percentage of about 0.2%, glycerol with a mass percentage of about 0.1%, dipentaerythritol pentaacrylate with a mass percentage of about 0.3%, and hydroquinone with a mass percentage of about 0.3%.

Example B

A copolymer of methyl methacrylate and methacrylic acid with a mass percentage of about 10%; nitroaniline with a mass percentage of about 5%; polyacrylic ethylenediimine diacetic acid chelating resin with a mass percentage of about 2%; propylene glycol monomethyl ether acetate with a mass percentage of about 82%; and the additive with a mass percentage of about 1%.

The additive with the mass percentage of about 1% includes: polyacrylic acid with a mass percentage of about 0.1%, polyoxypropylene glycerol ether with a mass percentage of about 0.2%, glycerol with a mass percentage of about 0.1%, dipentaerythritol pentaacrylate with a mass percentage of about 0.3%, and hydroquinone with a mass percentage of about 0.3%.

Example C

A copolymer of methyl methacrylate and methacrylic acid with a mass percentage of about 20%; nitroaniline with a mass percentage of about 4%; polyacrylic ethylenediimine diacetic acid chelating resin with a mass percentage of about 1.5%; propylene glycol monomethyl ether acetate with a mass percentage of about 73.5%; and the additive with a mass percentage of about 1%.

The additive with the mass percentage of about 1% includes: polyacrylic acid with a mass percentage of about 0.1%, polyoxypropylene glycerol ether with a mass percentage of about 0.2%, glycerol with a mass percentage of about 0.1%, dipentaerythritol pentaacrylate with a mass percentage of about 0.3%, and hydroquinone with a mass percentage of about 0.3%.

Example D

A copolymer of methyl methacrylate and methacrylic acid with a mass percentage of about 30%; nitroaniline with a mass percentage of about 4%; polyacrylic ethylenediimine diacetic acid chelating resin with a mass percentage of about 1%; propylene glycol monomethyl ether acetate with a mass percentage of about 64%; and the additive with a mass percentage of about 1%.

The additive with the mass percentage of about 1% includes: polyacrylic acid with a mass percentage of about 0.1%, polyoxypropylene glycerol ether with a mass percentage of about 0.2%, glycerol with a mass percentage of about 0.1%, dipentaerythritol pentaacrylate with a mass percentage of about 0.3%, and hydroquinone with a mass percentage of about 0.3%.

At least one embodiment of the present disclosure further provides a manufacturing method of a photoresist composition, and the manufacturing method includes: mixing a base material and an ion adsorbent, in which the ion adsorbent is a chelating resin.

For example, the base material comprises a film-forming resin, a photosensitizer, and an organic solvent, and an additive.

For example, in the photoresist composition manufactured by the above mentioned method, a mass percentage of the film-forming resin is about 5% to 30%; a mass percentage of the photosensitizer is about 2% to 5%; a mass percentage of the ion adsorbent is about 0.1% to 2%; a mass percentage of the organic solvent is about 62% to 93%; and a mass percentage of the additive is about 0.1% to 1%.

For example, the specific mass percentages of the film-forming resin, the sensitizer, the ion adsorbent, the organic solvent, and the additive can be referred to the relevant descriptions for the above products, and are omitted herein.

At least one embodiment of the present disclosure further provides a manufacturing method of a metal pattern. For example, FIG. 1 is a flowchart of a manufacturing method of a metal pattern provided by an embodiment of the present disclosure. The manufacturing method includes the following steps S1 to S4.

S1: providing a base substrate;

For example, the base substrate may be a substrate made of glass or a resin material.

S2: forming a metal thin film on the base substrate;

For example, a material of the metal film comprises any one or any combination of aluminum (Al), copper (Cu), molybdenum (Mo), chromium (Cr), aluminum-copper alloy (AlCu), copper-molybdenum alloy (CuMo), molybdenum aluminum alloy (MOAl), aluminum chromium alloy (AlCr), copper chromium alloy (CuCr), molybdenum chromium alloy (MoCr), and copper molybdenum aluminum alloy (CuMoAl).

S3: forming a photoresist composition on the metal film and forming a photoresist pattern;

For example, the photoresist composition is a positive photoresist or a negative photoresist. The solubility of the positive photoresist is increased after exposure, whereas the solubility of the negative photoresist is reduced after exposure. That is, a photoresist which is dissolved after being irradiated is the positive photoresist, and a photoresist retained after being irradiated is the negative photoresist. During forming a photoresist pattern, a mask is used to shield the light to form the photoresist pattern with a desired shape.

S4: patterning the metal film by using the photoresist pattern as a mask and using an etching liquid to form a metal pattern, in which the ion adsorbent in the photoresist pattern adsorbs metal ions formed during patterning the metal film.

For example, in at least one embodiment of the present disclosure, the etching liquid comprises a hydrogen peroxide solution.

For example, a monitor may be used to monitor a change of the concentration of the metal ions in the etching liquid in real time.

It should be noted that, in the process of etching, the ion adsorbent in the photoresist pattern can adsorb metal ions (for example, at least one of $Cu^{2+}$, $Al^{3+}$, $Cr^{2+}$ and $Mo^{3+}$) formed during etching, and the concentration of the metal ions in the etching liquid is maintained at a stable level to achieve a stable etching rate. As such, the etching stability, the etching uniformity, and the quality of the product are improved. In addition, the service life of the etching liquid is prolonged and the production cost is reduced.

It should be noted that, the ion adsorbent in the photoresist pattern can also adsorb metal ions contained in the etching liquid before the etching process.

At least one embodiment of the present disclosure further provides a manufacturing method of an array substrate, and the manufacturing method includes any one of the manufacturing methods of the metal pattern described above. Its specific implementation principle can refer to the related descriptions mentioned above, and details are not described herein again.

For example, the formed metal pattern may comprise at least one of a gate electrode, a first source/drain electrode, and a second source/drain electrode.

For example, the formed metal pattern is another film layer structure as long as the ion adsorbent in the photoresist pattern can adsorb metal ions formed during the process of etching.

The photoresist composition, the manufacturing method of the photoresist composition, the manufacturing method of the metal pattern and the manufacturing method of the array substrate provided by at least one embodiment of the present disclosure have at least one of the following beneficial effects:

(1) in the photoresist composition provided by at least one embodiment of the present disclosure, the ion adsorbent in the photoresist composition can adsorb metal ions formed during the process of etching, so that the concentration of metal ions in the etching liquid is maintained at a stable level;

(2) the photoresist composition provided by at least one embodiment of the present disclosure can afford a stable etching rate, an increased stability and uniformity of etching, and an improved quality of the product.

(3) the photoresist composition provided by at least one embodiment of the present disclosure can afford a prolonged service life of the etching liquid and a reduced production cost.

Please note that:

(1) the drawings of the embodiments of the present disclosure are only related to the structures mentioned in the embodiments of the present disclosure, and other structures can be further obtained by general designs;

(2) for the sake of clarity, in the drawings for describing the embodiments of the present disclosure, sizes of layers or regions are not drawn according to an actual scale but are exaggerated or diminished; it will be understood that when an element such as a layer, a film, a region or a substrate is referred to as being "on" or "under" another element, the element may be "directly" disposed "on" or "under" another element, or there may be an intermediate element;

(3) the embodiments of the present disclosure and the features therein can be combined with each other to obtain new embodiments in the absence of conflicts.

What are described above is related to only the illustrative embodiments of the present disclosure and not limitative to the protection scope of the present disclosure. The protection scope of the present disclosure shall be defined by the accompanying claims.

What is claimed is:

1. A photoresist composition, comprising a base material and an ion adsorbent, wherein the ion adsorbent is a chelating resin, the chelating resin comprises any one or any combination of polyacrylic ethylenediimine diacetic acid chelating resin, poly (4-glycine-methylene styrene) chelating resin, poly (2-hydroxyl-3-mercaptopropyl acrylate) chelating resin, and poly (6-vinyl-8-hydroxyquinoline) chelating resin, the base material comprises a film-forming resin, a photosensitizer, and an organic solvent, and wherein in a case that the photoresist composition is a positive photoresist composition, the film-forming resin is reacted with the photosensitizer, the film-forming resin comprises any one or any combination of a phenolic resin, a silicone resin, and a polyimide, and the photosensitizer is a diazonaphthoquinone-based photosensitizer, or in a case that the photoresist composition is a negative photoresist composition, the film-forming resin comprises a copolymer of an organic ester monomer, an organic acid monomer, monomer, and a polymerizable monomer, and the photosensitizer comprises any one or any combination of nitroaniline, anthraquinone, benzophenone, and N-acetyl-4-nitronaphthylamine, and wherein the chelating resin is configured to carry out coordination reaction with at least one of $Ni^{2-}$, $Zn^{2-}$, $Al^{3-}$, $Cr^{2-}$, $Pb^{2-}$, and $Mo^{3-}$ to form a chelate with a stable structure, and the chelate is evenly dispersed in the base material.

2. The photoresist composition according to claim 1, further comprising an additive, wherein a mass percentage of the film-forming resin is about 5% to 30%;

a mass percentage of the photosensitizer is about 2% to 5%; a mass percentage of the ion adsorbent is about 0.1% to 2%; a mass percentage of the organic solvent is about 62% to 93%;

and a mass percentage of the additive is about 0.1% to 1%.

3. The photoresist composition according to claim 1, wherein the organic solvent comprises any one or any combination of N-methyl pyrrolidone, glycol ether, ethylene glycol alkyl ether acetate, diethylene glycol, propylene glycol monomethyl ether acetate, ethoxyethyl acetate, dimethoxyacetaldehyde, propylene glycol methyl ether acetate, ethyl 3-ethoxypropionate, propylene glycol methyl ether (PM), and ethylene glycol ethyl ether acetate.

4. The photoresist composition according to claim 1, wherein the organic ester monomer comprises any one or any combination of methyl methacrylate, ethyl methacrylate, propyl methacrylate, butyl methacrylate, isobutyl methacrylate, and isoamyl acrylate; and the organic acid monomer comprises any one or any combination of methacrylic acid, crotonic acid, cinnamic acid, isocinnamic acid, alpha-methyl cinnamic acid, methyl acrylate, and methyl butenoate.

5. The photoresist composition according to claim 1, wherein the polymerizable monomer comprises any one or any combination of dipentaerythritol pentaacrylate, dipentaerythritol hexaacrylate, polyurethane acrylate, and ethoxylated pentaerythritol tetraacrylate.

6. The photoresist composition according to claim 1, wherein the negative photoresist composition further comprises a polymerization inhibitor, and the polymerization inhibitor comprises any one or any combination of hydroquinone, 2-sec-butyl-4,6-dinitrophenol, p-tert-butyl catechol, and 2,5-di-tert-butyl hydroquinone.

7. A manufacturing method of a metal pattern, comprising:
providing a base substrate;
forming a metal film on the base substrate;
forming the photoresist composition according to claim 1 on the metal film, and forming a photoresist pattern; and
patterning the metal film by using the photoresist pattern as a mask and using an etching liquid to form the metal pattern, wherein
the method further comprises: adsorbing metal ions formed during the patterning the metal film by using the ion adsorbent in the photoresist pattern.

8. The manufacturing method according to claim 7, wherein a material of the metal film comprises any one or any combination of aluminum (Al), copper (Cu), molybdenum (Mo), chromium (Cr), aluminum-copper alloy (AlCu), copper-molybdenum alloy (CuMo), molybdenum aluminum alloy (MoAl), aluminum chromium alloy (AlCr), copper chromium alloy (CuCr), molybdenum chromium alloy (MoCr), and copper molybdenum aluminum alloy (CuMoAl).

9. The manufacturing method according to claim 7, wherein the etching liquid comprises a hydrogen peroxide solution.

10. A manufacturing method of an array substrate, comprising the manufacturing method of the metal pattern according to claim 7.

11. The manufacturing method according to claim 10, wherein the metal pattern comprises at least one of a gate electrode, a first source/drain electrode, and a second source/drain electrode.

12. A manufacturing method of a photoresist composition, comprising:

mixing a base material and an ion adsorbent, wherein the ion adsorbent is a chelating resin, the chelating resin comprises any one or any combination of polyacrylic ethylenediimine diacetic acid chelating resin, poly (4-glycine-methylene styrene) chelating resin, poly (2-hydroxyl-3-mercaptopropyl acrylate) chelating resin, and poly (6-vinyl-8-hydroxyquinoline) the base material comprises a film-forming resin, a photosensitizer, and an organic solvent, and wherein in a case that the photoresist composition is a positive photoresist composition, the film-forming resin is reacted with the photosensitizer, the film-forming resin comprises any one or any combination of a phenolic resin, a silicone resin, and a polyimide, and the photosensitizer is a diazonaphthoquinone-based photosensitizer, or in a case that the photoresist composition is a negative photoresist composition, the film-forming resin comprises a copolymer of an organic ester monomer, an organic acid monomer, and a polymerizable monomer, and the photosensitizer comprises any one or any combination of nitroaniline, anthraquinone, benzophenone, and N-acetyl-4-nitronaphthylamine, and wherein the chelating resin is configured to carry out coordination reaction with at least one of $Ni^{2-}$, $Zn^{2-}$, $Al^{3-}$, $Cr^{2-}$, $Pb^{2-}$, and $Mo^{3-}$ to form a chelate with a stable structure, and the chelate is evenly dispersed in the base material.

13. The manufacturing method according to claim 12, wherein a mass percentage of the film-forming resin is about 5% to 30%; a mass percentage of the photosensitizer is about 2% to 5%; a mass percentage of the ion adsorbent is about 0.1% to 2%; a mass percentage of the organic solvent is about 62% to 93%; and a mass percentage of an additive is about 0.1% to 1%.

* * * * *